United States Patent
Ryu et al.

(10) Patent No.: US 11,590,542 B2
(45) Date of Patent: Feb. 28, 2023

(54) PARTICLE COLLECTION DEVICE AND MASK CLEANING DEVICE HAVING THE SAME

(71) Applicant: Samsung Display Co., Ltd., Yongin-si (KR)

(72) Inventors: Yong-Hwan Ryu, Yongin-si (KR); Jiae Kim, Gwangmyeong-si (KR); Yunji Nam, Suwon-si (KR); Sun-Jin Song, Asan-si (KR); In-Ja Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 16/918,013

(22) Filed: Jul. 1, 2020

(65) Prior Publication Data
US 2021/0001382 A1  Jan. 7, 2021

(30) Foreign Application Priority Data
Jul. 2, 2019  (KR) .......................... 10-2019-0079635

(51) Int. Cl.
| | | |
|---|---|---|
| *B08B 3/14* | (2006.01) | |
| *B08B 7/04* | (2006.01) | |
| *H01L 21/67* | (2006.01) | |
| *C23C 16/04* | (2006.01) | |
| *H01L 27/32* | (2006.01) | |
| *H01L 51/52* | (2006.01) | |

(52) U.S. Cl.
CPC ............... *B08B 3/14* (2013.01); *B08B 7/04* (2013.01); *H01L 21/67017* (2013.01); *C23C 16/042* (2013.01); *H01L 27/3246* (2013.01); *H01L 51/5253* (2013.01)

(58) Field of Classification Search
CPC ....... B08B 3/14; B08B 7/04; H01L 21/67017; H01L 27/3246; H01L 51/5253; C23C 16/042
USPC ...................................................... 134/115 r
See application file for complete search history.

(56) References Cited

U.S. PATENT DOCUMENTS 5,413,225 A * 5/1995 Shields ..................... B03C 1/30
                                                              209/614

FOREIGN PATENT DOCUMENTS

| KR | 10-2009-0073455 | 7/2009 |
|---|---|---|
| KR | 10-1305011 | 9/2013 |
| KR | 10-1932629 | 12/2018 |

OTHER PUBLICATIONS

KR101932629B1—machine translation (Year: 2018).*
WO2016067821A1—machine translation (Year: 2016).*

* cited by examiner

*Primary Examiner* — Tinsae B Ayalew
(74) *Attorney, Agent, or Firm* — H.C. Park & Associates, PLC

(57) ABSTRACT

A particle collection device includes a collection sheet and a frame on which the collection sheet is mounted. The collection sheet includes a base sheet, a magnetic substance, and a metal protrusion disposed on the base sheet to be adjacent to the magnetic substance.

15 Claims, 12 Drawing Sheets

PARTICLE COLLECTION DEVICE AND MASK CLEANING DEVICE HAVING THE SAME

CROSS-REFERENCE TO RELATED APPLICATION

This application claims priority from and the benefit of Korean Patent Application No. 10-2019-0079635, filed on Jul. 2, 2019, which is hereby incorporated by reference for all purposes as if fully set forth herein.

BACKGROUND

Field

Exemplary embodiments of the invention relate generally to a particle collection device and a mask cleaning device having the same. More specifically, the present invention relates to a particle collection device having improved particle collection efficiency and a mask cleaning device having the particle collection device.

Discussion of the Background

As a method of forming a thin layer of an organic compound in an organic light emitting display device, a vacuum deposition method, a sputtering method, an ion-beam deposition method, a pulsed-laser deposition method, a molecular beam deposition method, a chemical vapor deposition (CVD) method, or a spin coating method may be used.

The most commonly-used method among these is the vacuum deposition method that forms the thin layer by combining a deposition source and a substrate for the thin layer formation in a vacuum chamber, and this is a representative method to form a light emitting layer of an organic electroluminescent light emitting element. However, since a mask used for the deposition process is manufactured by an etching method, a width of the mask pattern is limited.

An electroplating method is used to manufacture masks that are suitable for high-resolution products. An electroplating mask implements the high resolution products, and thus is widely used to form the light emitting layer of the organic electroluminescent light emitting element.

The electroplating mask is immersed in a cleaning tank containing a cleaning solution after being used a predetermined number of times to perform a cleaning process. However, the cleaning efficiency of the mask is deteriorated due to particles floating in the cleaning solution.

The above information disclosed in this Background section is only for understanding of the background of the inventive concepts, and, therefore, it may contain information that does not constitute prior art.

SUMMARY

One or more exemplary embodiments of the inventive concepts provide a particle collection device having improved particle collection efficiency.

One or more exemplary embodiments of the inventive concepts also provide a mask cleaning device capable of improving a cleaning efficiency of a mask using the particle collection device.

Additional features of the inventive concepts will be set forth in the description which follows, and in part will be apparent from the description, or may be learned by practice of the inventive concepts.

Embodiments of the inventive concepts provide a particle collection device including a collection sheet including a base sheet, a magnetic substance, and a metal protrusion disposed on the base sheet to be adjacent to the magnetic substance and a frame on which the collection sheet is mounted.

The magnetic substance may be buried in the base sheet to be surrounded by the base sheet.

The metal protrusion may be disposed on one side surface of the base sheet.

The metal protrusion may be disposed on a first side surface of the base sheet and a second side surface opposite the first side surface.

The magnetic substance may have a stripe shape extending in a longitudinal direction of the base sheet.

A plurality of the metal protrusions may be provided, and the metal protrusions may be arranged in the longitudinal direction along the magnetic substance.

Embodiments of the inventive concepts provide a particle collection device including a collection sheet including a base sheet, a first magnetic substance buried in the base sheet, and a second magnetic substance disposed on the base sheet and a frame on which the collection sheet is mounted.

The second magnetic substance may be disposed on one side surface of the base sheet.

The second magnetic substance may be disposed on a first side surface of the base sheet and a second side surface opposite the first side surface.

The first magnetic substance may have a stripe shape extending in a longitudinal direction of the base sheet.

A plurality of second magnetic substances may be provided, and the second magnetic substances may be arranged in the longitudinal direction along the first magnetic substance.

The collection sheet may further include a capping layer that covers the second magnetic substance. The capping layer may include a metal material.

Embodiments of the inventive concepts further provide a mask cleaning device including a cleaning tank and a particle collection device. The cleaning tank includes a cleaning solution and cleans a mask assembly disposed in the cleaning tank using the cleaning solution, and the particle collection device is disposed in the cleaning tank to collect particles floating in the cleaning solution. The particle collection device includes a plurality of collection sheets including a base sheet, a magnetic substance, and a metal protrusion disposed on the base sheet to be adjacent to the magnetic substance and a frame on which the collection sheets are mounted.

The mask assembly may include a plurality of mask sheets each in which a processing pattern is formed and a mask frame on which the mask sheets are mounted. The frame may have a size corresponding to the mask frame.

A plurality of the mask assemblies may be provided, and the particle collection device may be disposed between the mask assemblies.

The magnetic substance may be buried in the base sheet to be surrounded by the base sheet, and the metal protrusion may be disposed at least one side surface of the base sheet.

The magnetic substance may have a stripe shape extending in a longitudinal direction of the base sheet.

A plurality of metal protrusions may be provided, and the metal protrusions may be arranged in the longitudinal direction along the magnetic substance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
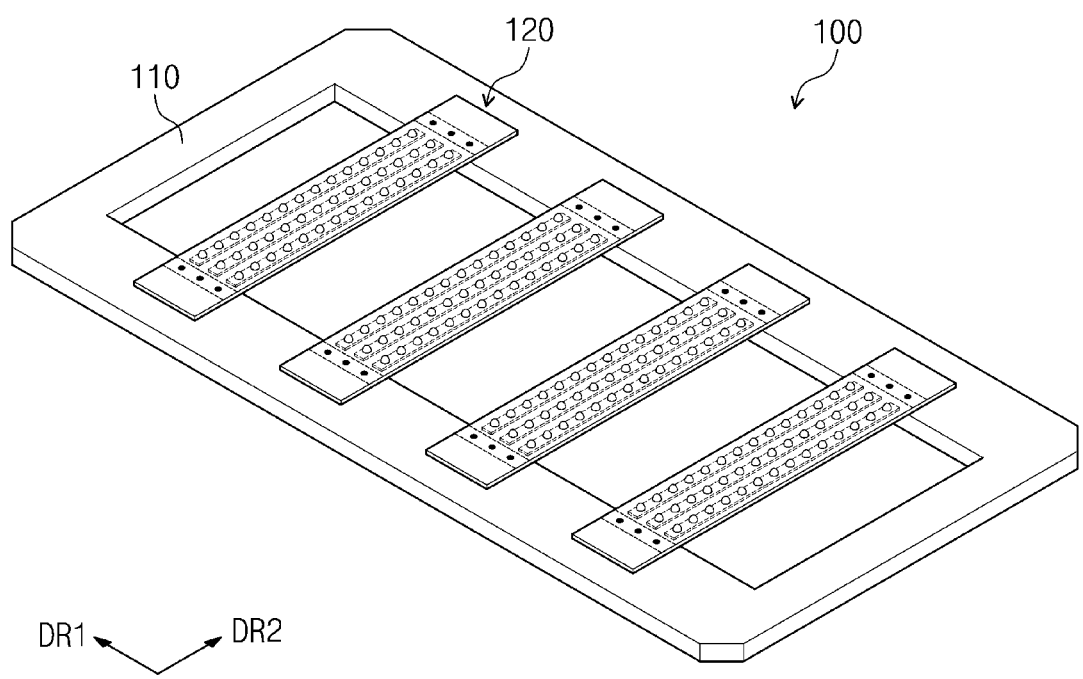
FIG. 1 is a perspective view showing a particle collection device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
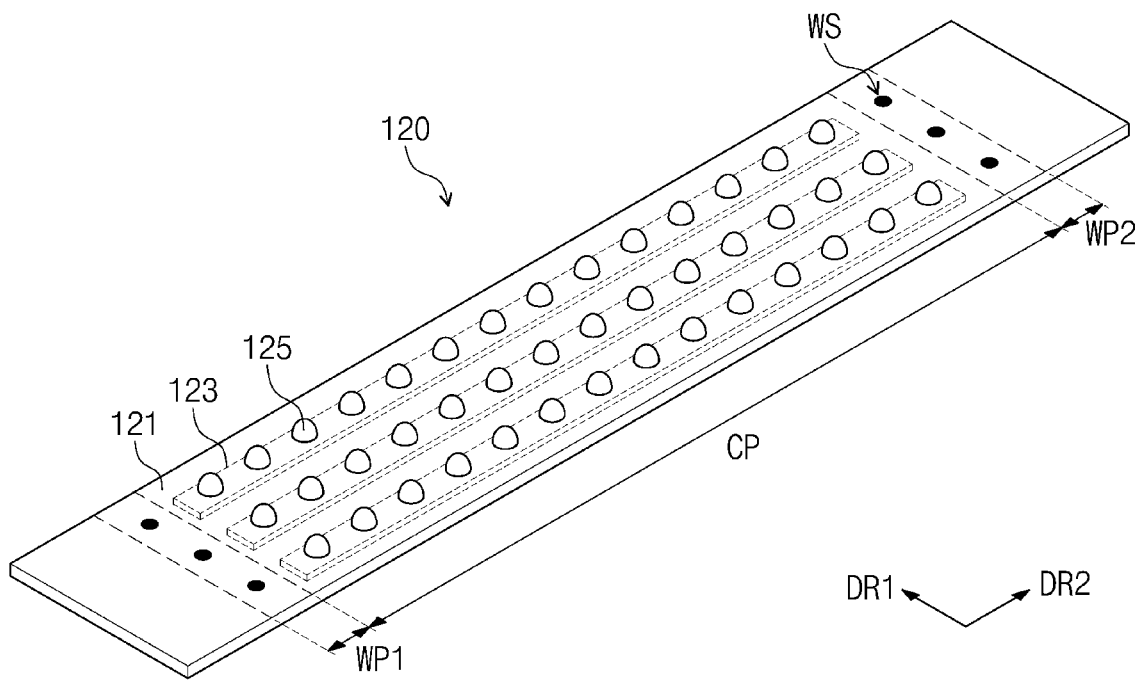
FIG. 2 is a perspective view showing a collection sheet shown in FIG. 1.
Figure 3:
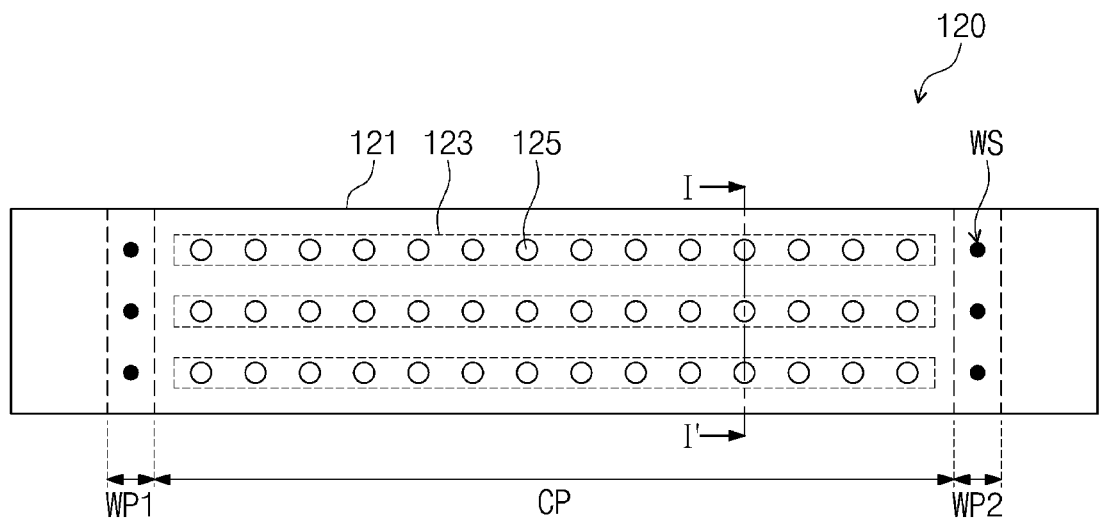
FIG. 3 is a plan view showing the collection sheet shown in FIG. 2.

FIG. 1 is a perspective view showing a particle collection device 100 according to an exemplary embodiment, FIG. 2 is a perspective view showing a collection sheet 120 shown in FIG. 1, and FIG. 3 is a plan view showing the collection sheet 120 shown in FIG. 2.

Referring to FIGS. 1 to 3, the particle collection device 100 may include a frame 110 and at least one collection sheet 120 placed on the frame 110.

The frame 110 may have a frame shape whose center portion is open. FIG. 1 shows the frame 110 that includes one frame body, however, it should not be limited thereto. When the size of the particle collection device 100 increases, the frame 100 may include a plurality of frame bodies. In this case, the frame bodies may be connected to each other to form one frame.

The collection sheet 120 may be disposed on the frame 110. As an example of the inventive concepts, a structure in which a plurality of collection sheets is disposed on the frame 110 is shown. The number of the collection sheets 120 included in the particle collection device 100 should not be particularly limited.

The collection sheets 120 may be fixed to the frame 110 by welding. The collection sheets 120 may be arranged along one side direction (hereinafter, referred to as a "first direction DR1") of the frame 110 to be adjacent to each other. In this case, the collection sheets 120 may shield the open central portion of the frame 110.

Each collection sheet 120 may have a structure extending in one direction. When the collection sheets 120 are arranged in the first direction DR1, a longitudinal direction of each collection sheet 120 may be substantially parallel to a second direction DR2 perpendicular to the first direction DR1. That is, each collection sheet 120 has the structure extending in the second direction DR2.

Referring to FIGS. 2 and 3, the collection sheet 120 may include a base sheet 121, a magnetic substance 123, and a metal protrusion 125. The base sheet 121 may be formed of a nickel-iron alloy.

The base sheet 121 includes a collection portion CP and welding portions WP1 and WP2 connected to the collection portion CP. The magnetic substance 123 and the metal protrusion 125 may be arranged in the collection portion CP. As an example of the inventive concepts, three magnetic substances 123 are arranged in the base sheet 121, however, the number of the magnetic substances 123 should not be limited to three. The magnetic substances 123 extend in the second direction DR2 along the base sheet 121 in the form of a stripe shape. The three magnetic substances 123 may be arranged at regular intervals in the first direction DR1.

The magnetic substances 123 may be buried in the base sheet 121 so as not to be exposed to the outside. That is, the magnetic substances 123 may be entirely surrounded by the base sheet 121.

The metal protrusion 125 may be disposed on one side surface of the base sheet 121. As an example of the inventive concepts, a plurality of metal protrusions 125 may be disposed on the one side surface of the base sheet 121. The metal protrusions 125 may be disposed on each magnetic substance 123. The metal protrusions 125 may be disposed on the one side surface of the base sheet 121 to face a corresponding magnetic substance 123. The metal protrusions 125 may be arranged along the extension direction, i.e., the second direction DR2, of the corresponding magnetic substance 123.

Each metal protrusion 125 may be formed of a metal material. As an example of the inventive concepts, the metal material may include nickel or iron. The metal protrusions 125 may be formed on the base sheet 121 by welding or may be formed by protruding or raising portions of the base sheet 121. That is, when the base sheet 121 is protruded or raised to form the metal protrusions 125, the base sheet 121 may be integrally formed with the metal protrusions 125.

As an example of the inventive concepts, each metal protrusion 125 may have a hemispherical shape, however, it should not be limited thereto.

The metal protrusions 125 may be magnetized by the corresponding magnetic substance 123. The magnetized metal protrusions 125 may serve as seeds to collect metal particles during a particle collection process. That is, the metal particles may be collected on a surface of each metal protrusion 125.

The welding portions WP1 and WP2 may include a first welding portion WP1 connected to a first end of the collection portion CP and a second welding portion WP2 connected to a second end of the collection portion CP. The first and second welding portions WP1 and WP2 may be placed on the frame 110.

The collection sheet 120 and the frame 110 may be fixed to each other by welding in each of the first and second welding portions WP1 and WP2. That is, a welding spot WS at which the collection sheet 120 and the frame 110 are welded to each other may be provided, and a plurality of welding spots WS may be provided in each of the first and second welding portions WP1 and WP2.

Figure 4A:
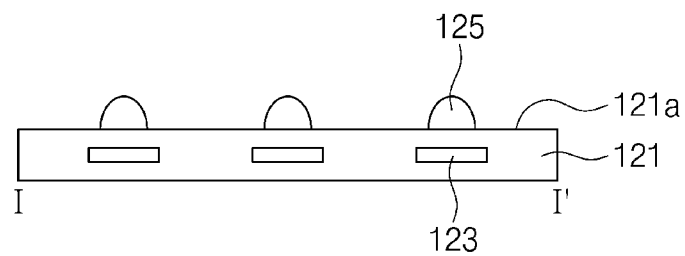
FIGS. 4A, 4B, 4C, 4D, and 4E are cross-sectional views taken along a line I-I' of FIG. 3 to show collection sheets according to exemplary embodiments of the inventive concepts.

FIGS. 4A, 4B, 4C, 4D, and 4E are cross-sectional views taken along a line I-I' of FIG. 3 to show collection sheets according to exemplary embodiments Referring to FIG. 4A, the magnetic substances 123 are buried in the base sheet 121 and not exposed to the outside. The magnetic substances 123 may be entirely surrounded by the base sheet 121.

The metal protrusions 125 are provided on one side surface 121a of the base sheet 121. The metal protrusions 125 may be disposed on the corresponding magnetic substance 123 and may be magnetized by the corresponding magnetic substance 123.

Figure 4B:
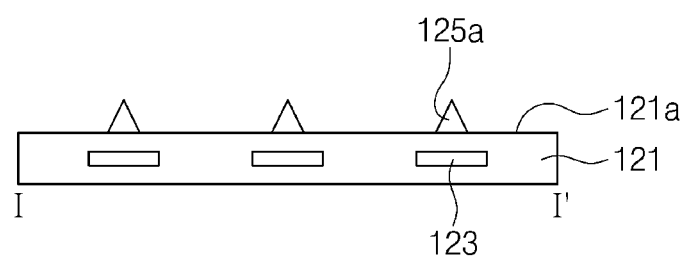
Figure 4C:
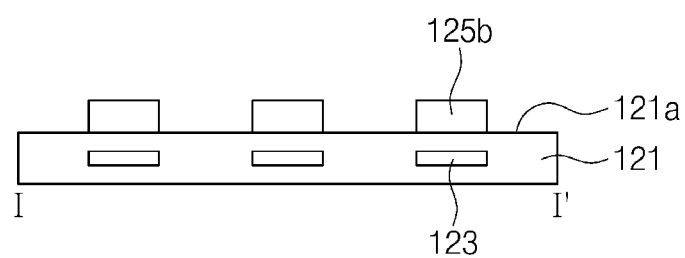

Each of the metal protrusions 125 may have the hemispherical shape, however, the shape of the metal protrusions 125 should not be particularly limited. That is, as shown in FIGS. 4B and 4C, each of the metal protrusions 125a and 125b may have a conical shape or a cylindrical shape. As another example, each of the metal protrusions 125 may have a prismatic or pyramidal shape.

Figure 4D:
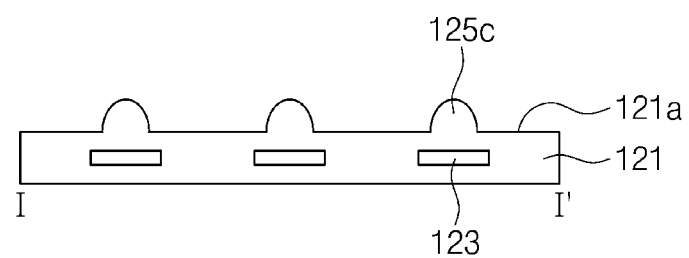

FIGS. 4A, 4B, and 4C show a structure in which metal protrusions 125, 125a, and 125b are provided on an upper surface of the base sheet 121 as separate members, however, the inventive concepts should not be limited thereto. That is, as shown in FIG. 4D, the metal protrusions 125c may be formed by protruding or raising portions of the one side surface 121a of the base sheet 121. In this case, the metal protrusions 125c may be integrally formed with the base sheet 121.

Figure 4E:
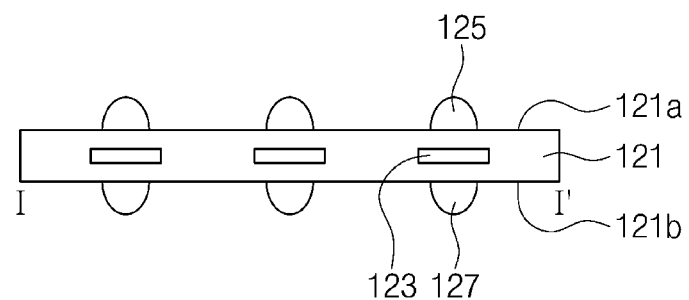

As shown in FIGS. 3 and 4E, the collection sheet 120 may include first and second metal protrusions 125 and 127. The first metal protrusion 125 may be disposed on a first surface 121a of the base sheet 121, and the second metal protrusion 127 may be disposed on a second surface 121b of the base sheet 121. That is, the first metal protrusion 125 may be disposed on the corresponding magnetic substance 123, and the second metal protrusion 127 may be disposed under the corresponding magnetic substance 123. As described above, when the metal protrusions 125 and 127 are respectively disposed on both side surfaces of the collection sheet 120, the collection sheet 120 may efficiently collect the metal particles through both side surfaces thereof.

Figure 5:
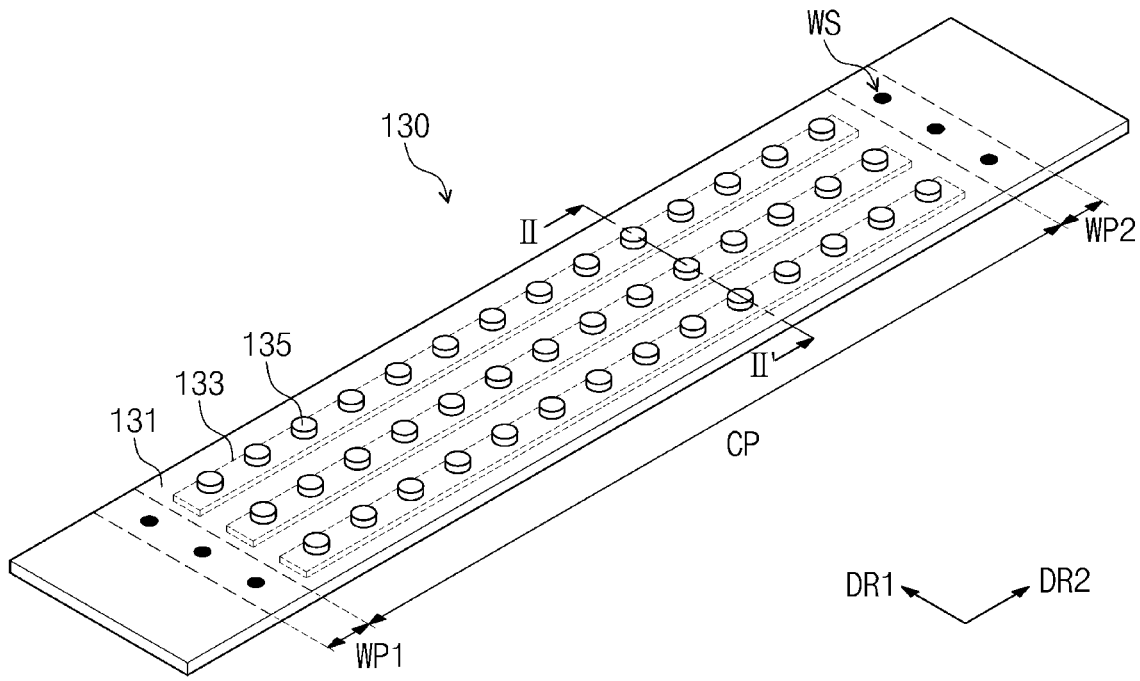
FIG. 5 is a perspective view showing a collection sheet according to an exemplary embodiment of the inventive concepts.
Figure 6:
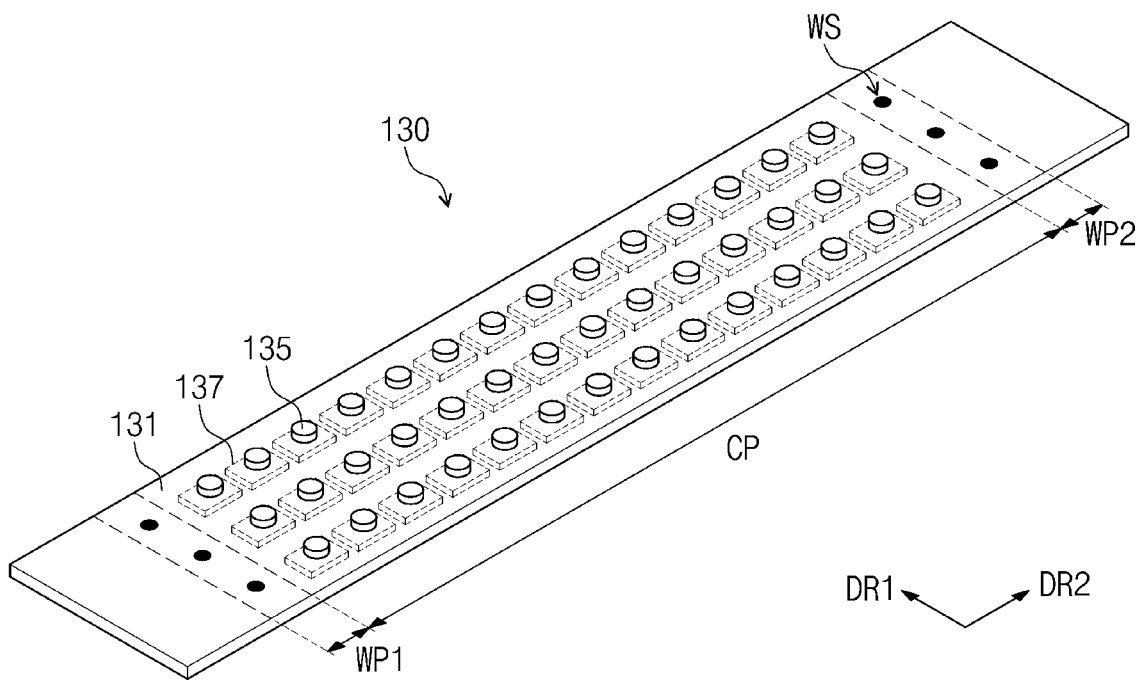
FIG. 6 is a perspective view showing a collection sheet according to an exemplary embodiment of the inventive concepts.

FIG. 5 is a perspective view showing a collection sheet 130 according to an exemplary embodiment, and FIG. 6 is a perspective view showing a collection sheet 130 according to another exemplary embodiment. In FIGS. 5 and 6, the same reference numerals denote the same elements in FIGS. 2 and 3, and thus detailed descriptions of the same elements will be omitted.

Referring to FIG. 5, the collection sheet 130 of the particle collection device according to the exemplary embodiment includes a base sheet 131, a first magnetic substance 133 buried in the base sheet 131, and a second magnetic substance 135 disposed on the base sheet 131.

The first magnetic substance 133 may extend in the second direction DR2 along the base sheet 131 and may be formed in a stripe shape. Three first magnetic substances 133 may be arranged in the first direction DR1 at regular intervals. The first magnetic substances 133 may be buried in the base sheet 131 so as not to be exposed to the outside. That is, the first magnetic substances 133 may be entirely surrounded by the base sheet 131.

The second magnetic substance 135 may be attached and fixed to one side surface of the base sheet 131 due to a magnetic force. A plurality of the second magnetic substances 135 may be provided, and the second magnetic substances 135 may be arranged in the second direction DR2 along the first magnetic substance 133. The second magnetic substances 135 may be disposed on the one side surface of the base sheet 131 to face corresponding first magnetic substances 133, respectively.

As an example of the inventive concepts, each of the second magnetic substances 135 has a cylindrical shape, however, the shape of the second magnetic substances 135 should not be limited to the cylindrical shape. In the present exemplary embodiment, the second magnetic substances 135 may serve as seeds collecting the metal particles during the particle collection process.

Referring to FIG. 6, a plurality of first magnetic substances 137 may be provided, and the first magnetic substances 137 may be arranged in the first and second directions DR1 and DR2.

The second magnetic substance 135 may be attached and fixed to one side surface of a base sheet 131 due to a magnetic force. A plurality of second magnetic substances 135 may be provided, and the second magnetic substances 135 may be arranged to correspond to each of the first magnetic substances 137, respectively. The second magnetic substances 135 may be disposed on the one side surface of the base sheet 131 to face corresponding first magnetic substances 137, respectively.

FIG. 6 shows a structure in which the first magnetic substances 137 correspond to the second magnetic substances 135 in a one-to-one correspondence, however, the inventive concepts should not be limited thereto. In detail, plural second magnetic substances 135 may be attached to one first magnetic substance 137.

FIGS. 7A, 7B, 7C, and 7D are cross-sectional views taken along a line II-IF of FIG. 5 to show collection sheets according to exemplary embodiments.

Figure 7A:
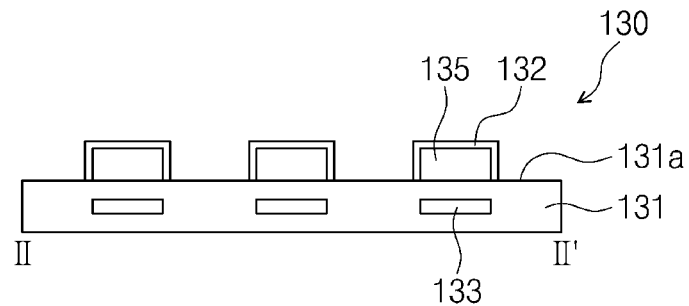
FIGS. 7A, 7B, 7C, and 7D are cross-sectional views taken along a line II-IF of FIG. 5 to show collection sheets according to exemplary embodiments of the inventive concepts.

Referring to FIG. 7A, first magnetic substances 133 are buried in a base sheet 131 and not exposed to the outside. The first magnetic substances 133 may be entirely surrounded by the base sheet 131.

Plural second magnetic substances 135 are provided on one side surface 131a of the base sheet 131. The second magnetic substances 135 may be attached and fixed to the one side surface 131a of the base sheet 131 due to a magnetic force.

Figure 7B:
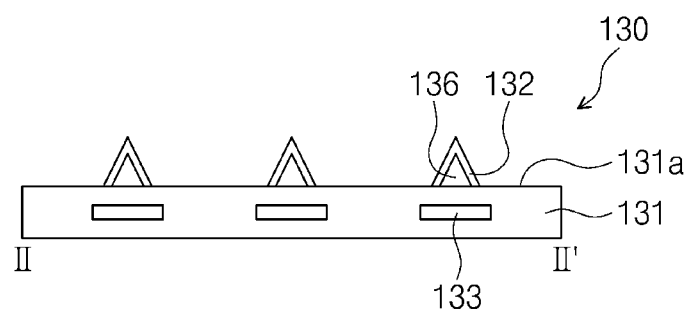
Figure 7C:
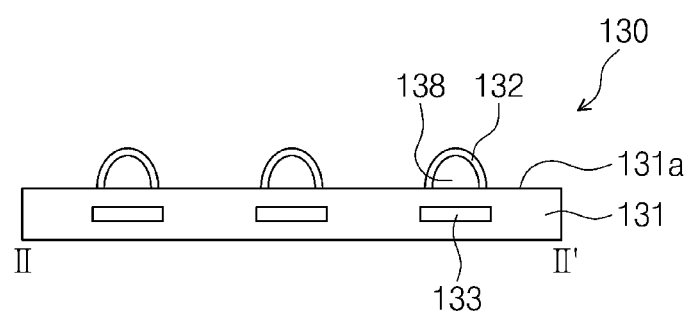

Each of the second magnetic substances 135 may have a cylindrical shape, however, it should not be particularly limited. That is, as shown in FIGS. 7B and 7C, each of the second magnetic substances 136 and 138 may have a conical shape or a hemispherical shape. As another example, each of the second magnetic substances 135, 136, and 138 may have a prismatic or pyramidal shape.

As shown in FIGS. 7A, 7B, and 7C, the collection sheet 130 may further include a capping layer 132 that covers each of second magnetic substances 135, 136, and 138. The capping layer 132 may be a layer coated to cover the second magnetic substances 135, 136, and 138. The capping layer 132 may be formed of a metal material. As an example of the inventive concepts, the metal material may include nickel or iron. The capping layer 132 may be magnetized by corresponding second magnetic substances 135, 136, and 138. In this case, each of the second magnetic substances 135, 136, and 138 and the capping layer covering the second magnetic substances 135, 136, and 138 may serve as seeds to collect the metal particles during the particle collection process. That is, the metal particles may be collected on a surface of the capping layer 132.

Figure 7D:
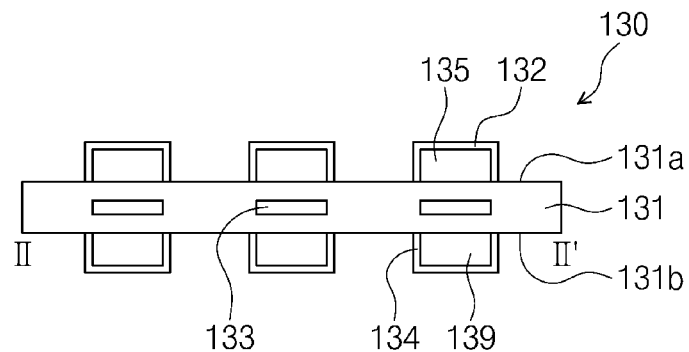

As shown in FIG. 7D, the collection sheet 130 may include second and third magnetic substances 135 and 139. The second magnetic substance 135 is disposed on a first surface 131a of the base sheet 131, and the third magnetic substance 139 is disposed on a second surface 131b of the base sheet 131. That is, the second magnetic substance 135 is disposed on a corresponding magnetic substance 133, and the third magnetic substance 139 is disposed under a corresponding magnetic substance 133. As described above, as the second and third magnetic substances 135 and 139 are respectively disposed on both side surfaces of the collection sheet 130, the metal particles are collected using the both surfaces of the collection sheet 130, and thus the collection efficiency may be improved.

Figure 8:
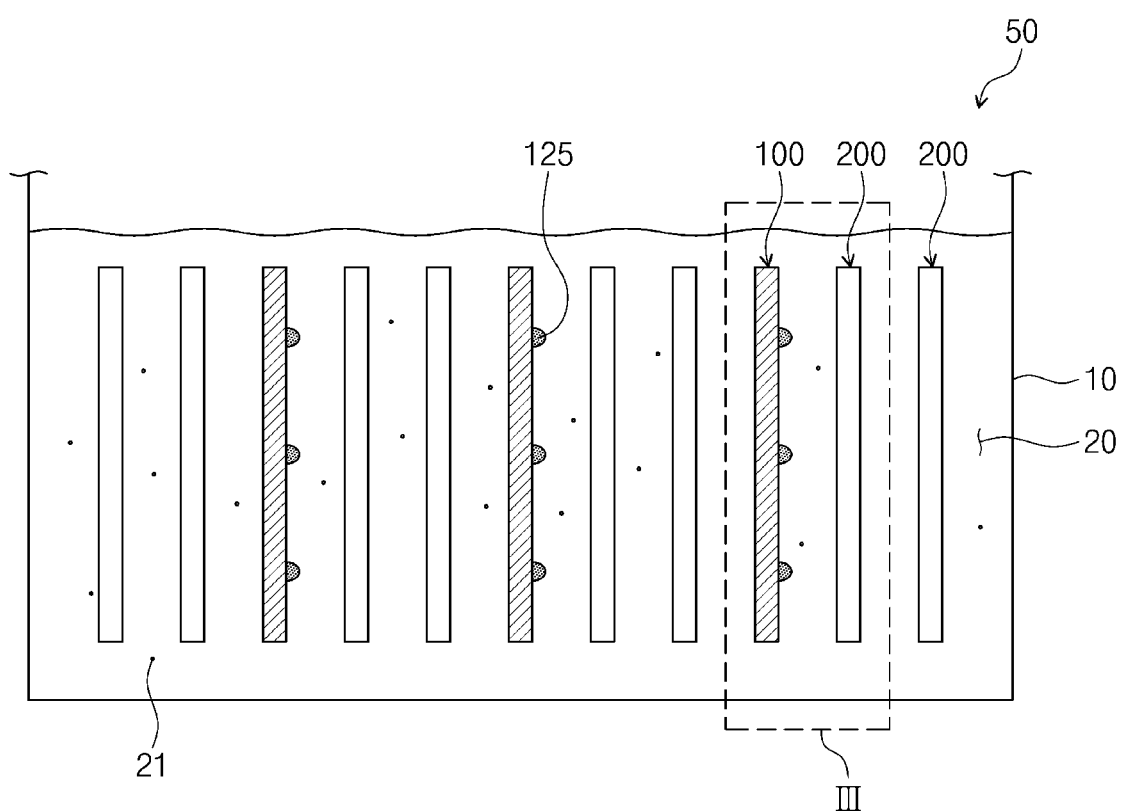
FIG. 8 is a side view showing a mask cleaning device according to an exemplary embodiment of the inventive concepts.
Figure 9:
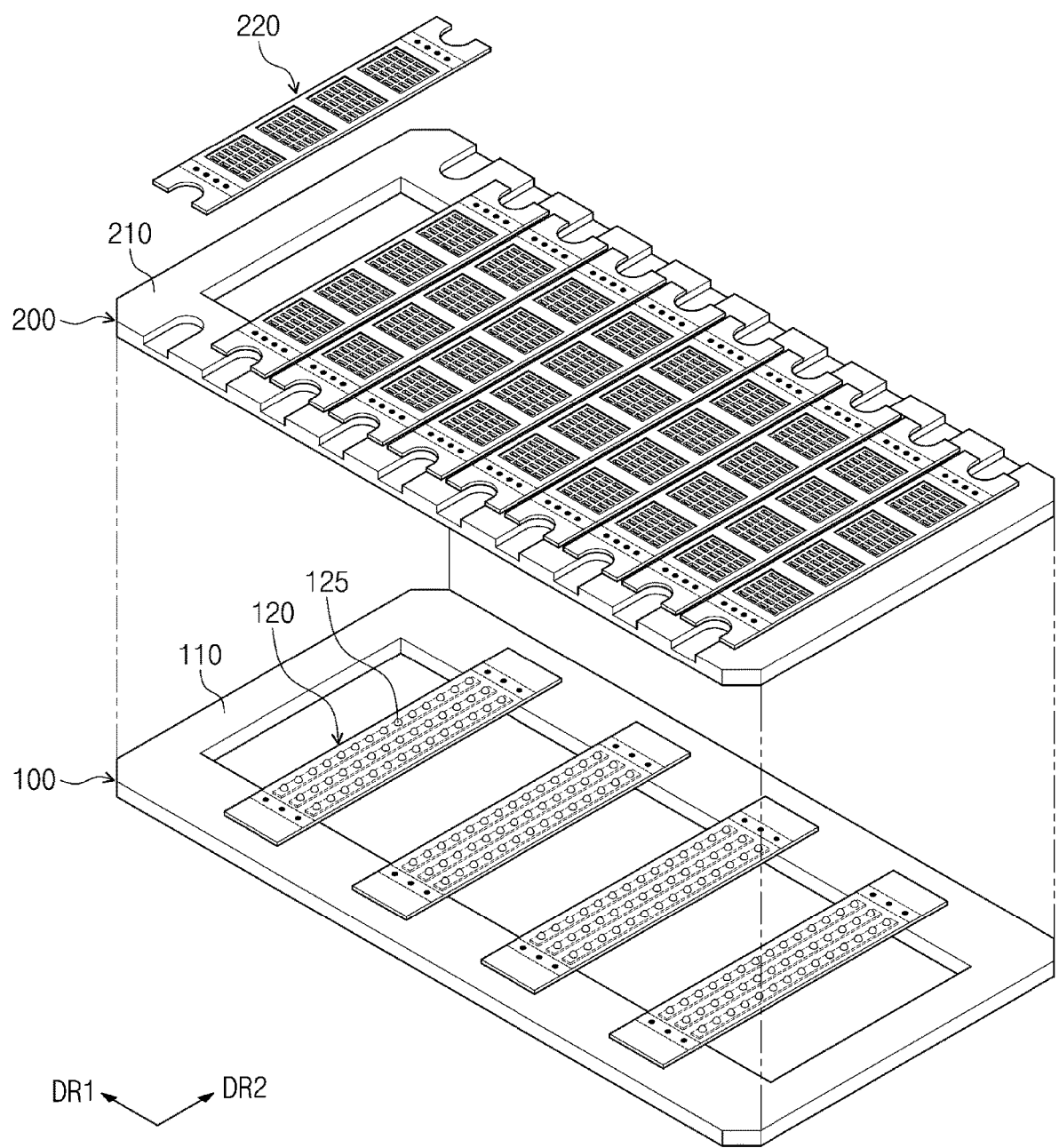
FIG. 9 is a perspective view showing a mask assembly and a particle collection device of an area III shown in FIG. 8.

FIG. 8 is a side view showing a mask cleaning device 50 according to an exemplary embodiment, and FIG. 9 is a perspective view showing a mask assembly 200 and a particle collection device 100 of an area III shown in FIG. 8.

Referring to FIGS. 8 and 9, the mask cleaning device 50 is used to clean the mask assembly 200. The mask cleaning device 50 includes a cleaning tank 10 containing a cleaning solution 20, the mask assembly 200 disposed in the cleaning tank 10 to be cleaned with the cleaning solution 20, and the particle collection device 100 disposed in the cleaning tank 10 to collect metal particles 21 floating in the cleaning solution 20.

The cleaning solution 20 may be used to clean foreign substances remaining in the mask assembly 200. The foreign substances may include an inorganic material, e.g., a metal material, or an organic material. The mask assembly 200 is immersed in the cleaning tank 10 filled with the cleaning solution 20, and the foreign substances attached to the mask assembly 200 may be removed by the cleaning solution 20. When the cleaning is completed, the mask assembly 200 may be withdrawn from the cleaning tank 10.

A plurality of mask assemblies 200 may be substantially simultaneously accommodated in the cleaning tank 10 and may be cleaned. When several cleaning processes are performed, the metal particles 21 floating in the cleaning solution 20 increase, and therefore, a particle removal process is required to remove the metal particles 21. During the particle removal process, the particle collection device 100 may be put into the cleaning tank 10 together with the mask assembly 200.

The particle collection device 100 has the structure shown in FIGS. 1 to 7D, and thus detailed descriptions of the particle collection device 100 will be omitted.

The particle collection device 100 may collect the metal particles 21 floating in the cleaning solution 20. The metal particles may be collected to the collection sheet 120 due to the magnetic force of the magnetic substance 23 and the magnetized metal protrusion 125, which are provided to the particle collection device 100. In particular, when the metal protrusion 125 is provided, an area for the collection of the collection sheet 120 may increase, and thus the collection efficiency may be improved. In addition, since the collection sheet 120 may have a partially protruding structure due to the metal protrusion 125, the metal protrusion 125 serves as the seed to accelerate the speed at which the metal particles are collected to the metal protrusion 125. As a result, the collection speed of the metal particles may increase, and the collection efficiency of the particle collection device 100 may be improved.

The mask assembly 200 may include a plurality of mask sheets 220 each on which a processing pattern is formed and a mask frame 210 on which the mask sheets 220 are placed. As shown in FIG. 9, the mask frame 210 may have a size corresponding to that of the frame 110 of the particle collection device 100. The number of the collection sheets 120 may be equal to or different from the number of the mask sheets 220. That is, FIG. 9 shows a structure in which the number of the collection sheets 120 mounted on the frame 110 is different from the number of the mask sheets 220 mounted on the mask frame 210, however, the inventive concepts should not be limited thereto. That is, the number of the collection sheets 120 mounted on the frame 110 may be equal to the number of the mask sheets 220 mounted on the mask frame 210.

As an example of the inventive concepts, the particle collection device 100 is disposed between the mask assemblies 200 in the cleaning tank 10, however, the position of the particle collection device 100 should not be limited thereto.

Figure 10:
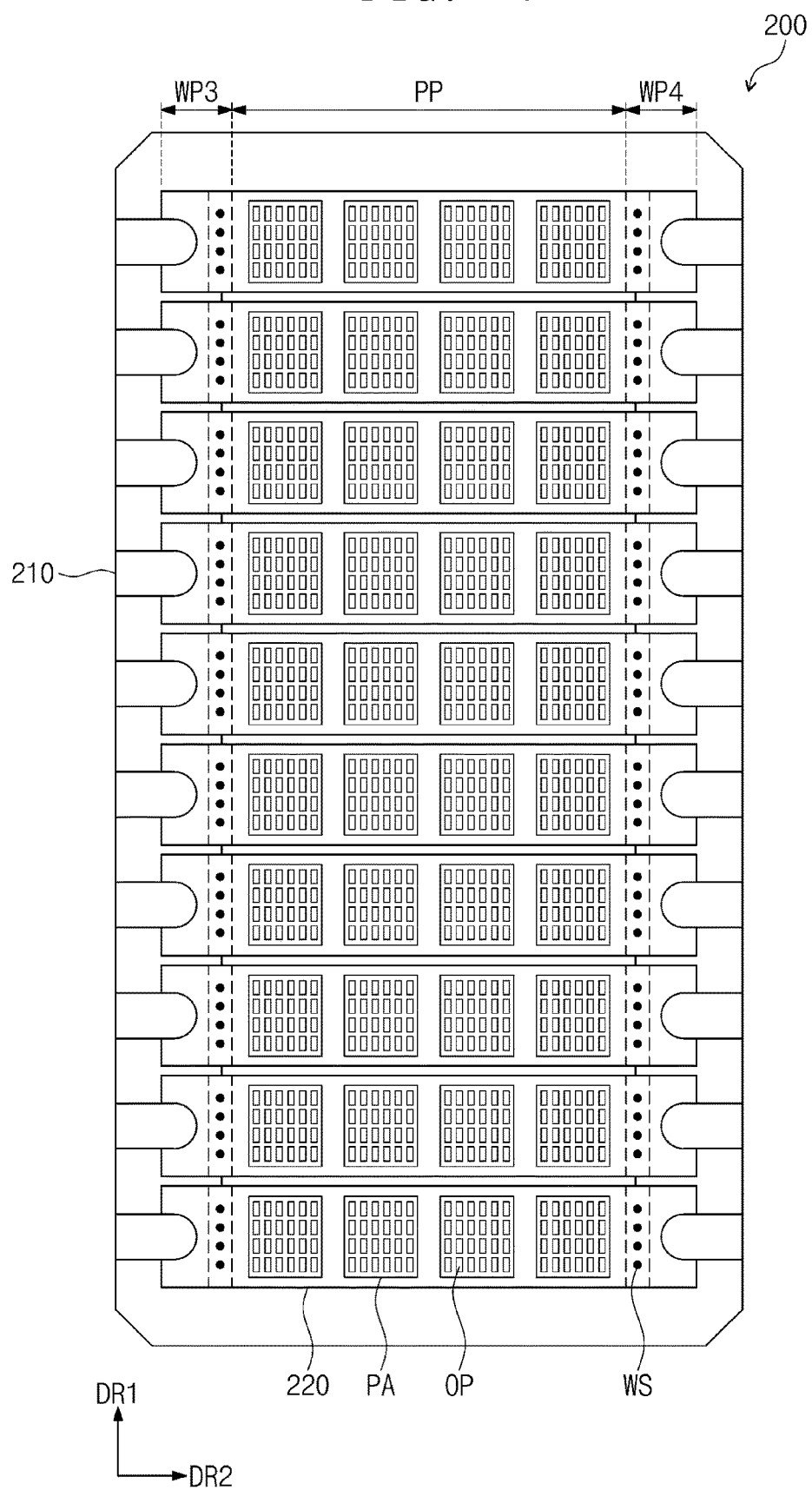
FIG. 10 is a plan view showing the mask assembly shown in FIG. 8.
Figure 11:
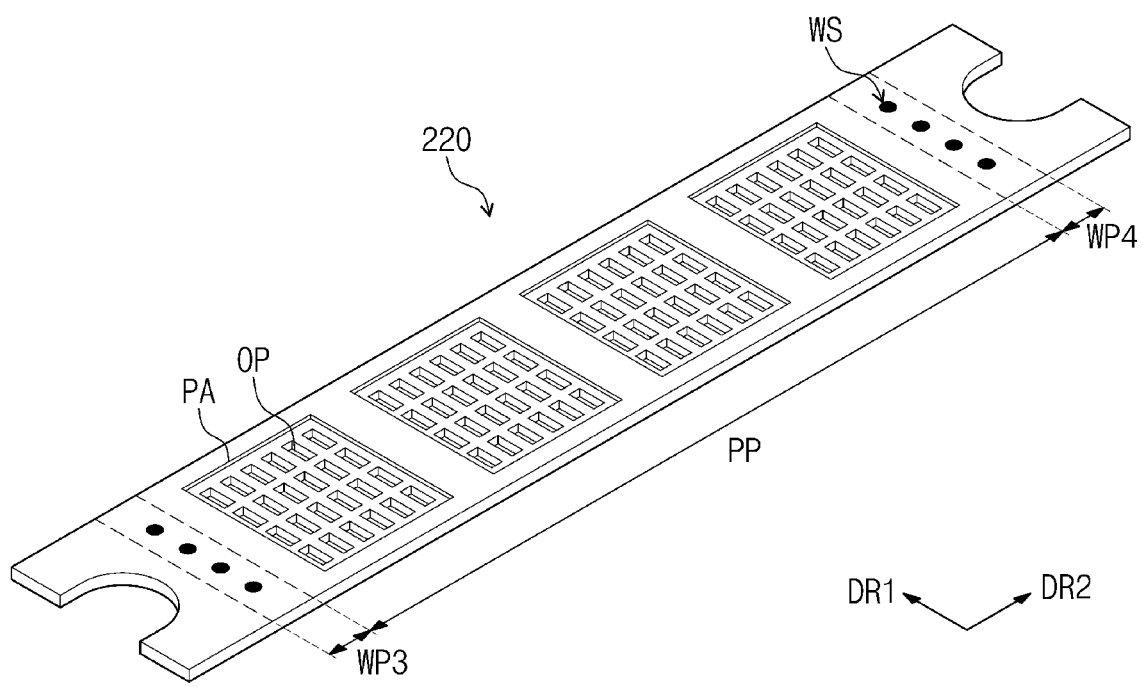
FIG. 11 is a perspective view showing a mask sheet shown in FIG. 10.

FIG. 10 is a plan view showing the mask assembly 200 shown in FIG. 9, and FIG. 11 is a perspective view showing the mask sheet 220 shown in FIG. 10.

Referring to FIGS. 9, 10, and 11, the mask assembly 200 may include the mask frame 210 and one or more mask sheets 220 disposed on the mask frame 210.

The mask frame 210 may have a frame shape whose center portion is open. FIG. 9 shows the mask frame 210 including one frame body, however, the mask frame 210 should not be limited thereto. When a size of the mask assembly 200 increases, the mask assembly 200 may include a plurality of frame bodies. In this case, the frame bodies may be connected to each other to form one mask frame.

The mask sheet 220 may be mounted on the mask frame 210. As an example of the inventive concepts, the structure in which the plural mask sheets are mounted on the mask frame 210 is shown. The number of the mask sheets 220 of the mask assembly 200 should not be particularly limited.

The mask sheets 220 may be attached to the mask frame 210 by welding. The mask sheets 220 may be arranged to be adjacent to each other along one side direction (hereinafter, referred to as the "first direction DR1") of the mask frame 210. In this case, the mask sheets 220 may shield the open center portion of the mask frame 210.

Each mask sheet 220 may have a structure extending in one direction. When the mask sheets 220 are arranged in the first direction DR1, a longitudinal direction of each mask sheet 220 may be substantially parallel to the second direction DR2 perpendicular to the first direction DR1.

Each mask sheet 220 may be formed of a nickel-iron alloy. In this case, a nickel content may be within a range from about 30 wt % to 50 wt % with respect to a total weight of each mask sheet 220.

Referring to FIGS. 10 and 11, each mask sheet 220 includes a pattern portion PP and welding portions WP3 and WP4 connected to the pattern portion PP. The pattern portion PP may include one or more pattern areas PA. As an example of the inventive concepts, a structure in which the pattern portion PP includes four pattern areas PA is shown, however, the number of the pattern areas AP should not be limited to four. The pattern areas PA may be arranged at regular intervals in the second direction DR2. Each pattern area PA may correspond to a processing area of a target substrate on which a deposition material is deposited.

A plurality of openings OP may be defined in each pattern area PA. The openings OP may be arranged to be spaced apart from each other at regular intervals and may form a regular pattern.

The welding portions WP3 and WP4 may include a third welding portion WP3 connected to a first end of the pattern portion PP and a fourth welding portion WP4 connected to a second end of the pattern portion PP. The third and fourth welding portions WP3 and WP4 may be placed on the mask frame 210.

The mask sheet 220 and the mask frame 210 may be fixed to each other by welding in each of the third and fourth welding portions WP3 and WP4. That is, a welding spot WS at which the mask sheet 220 and the mask frame 210 are welded to each other may be provided, and a plurality of welding spots WS may be provided in each of the third and fourth welding portions WP3 and WP4.

The mask assembly 200 may be used to form a light emitting layer EML (refer to FIG. 14) of an organic light emitting display device. Hereinafter, the organic light emitting display device will be described in detail.

Figure 12:
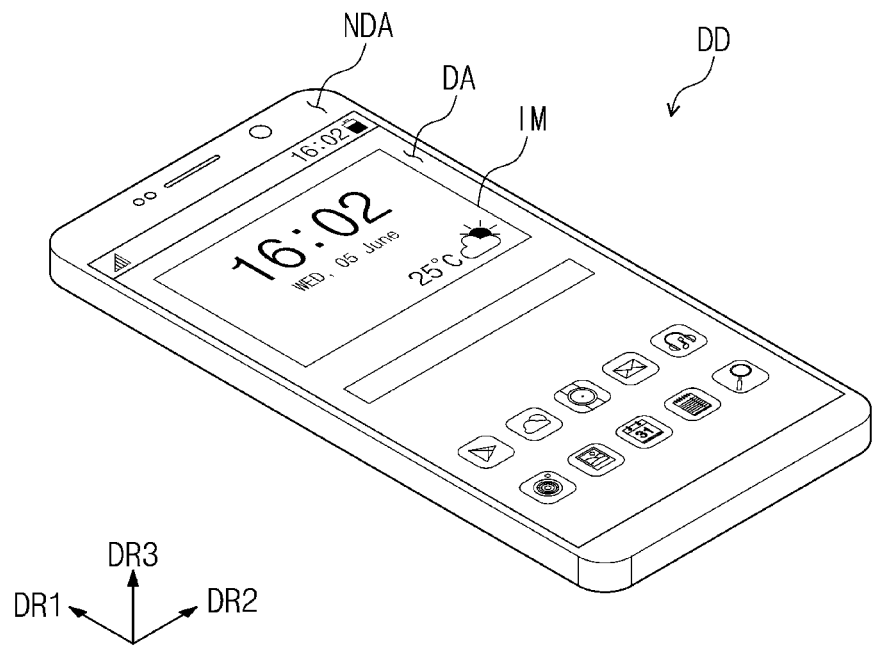
FIG. 12 is a perspective view showing a display device according to an exemplary embodiment of the inventive concepts.
Figure 13:
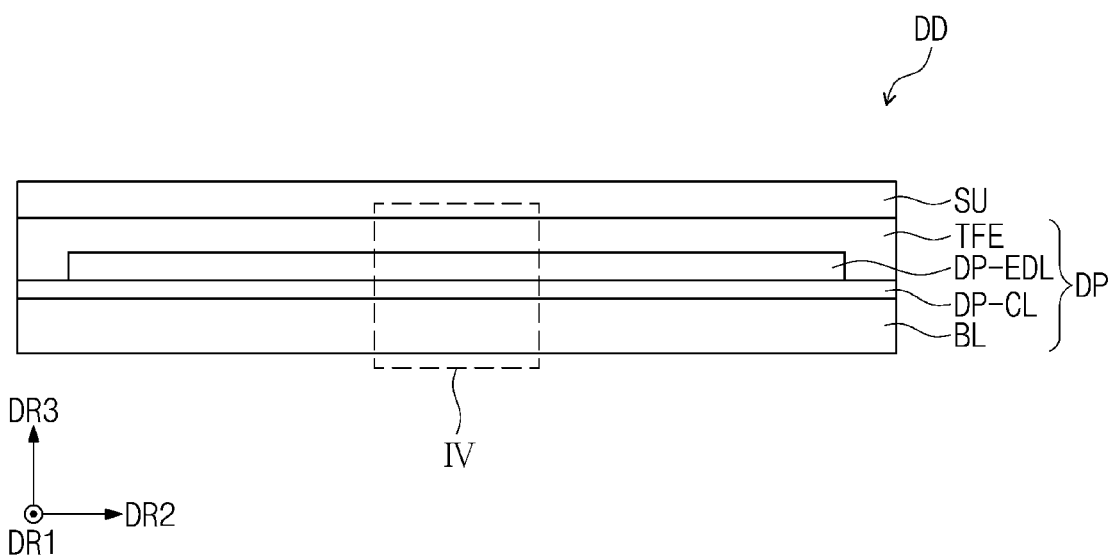
FIG. 13 is a cross-sectional view showing a display device according to an exemplary embodiment of the inventive concepts.
Figure 14:
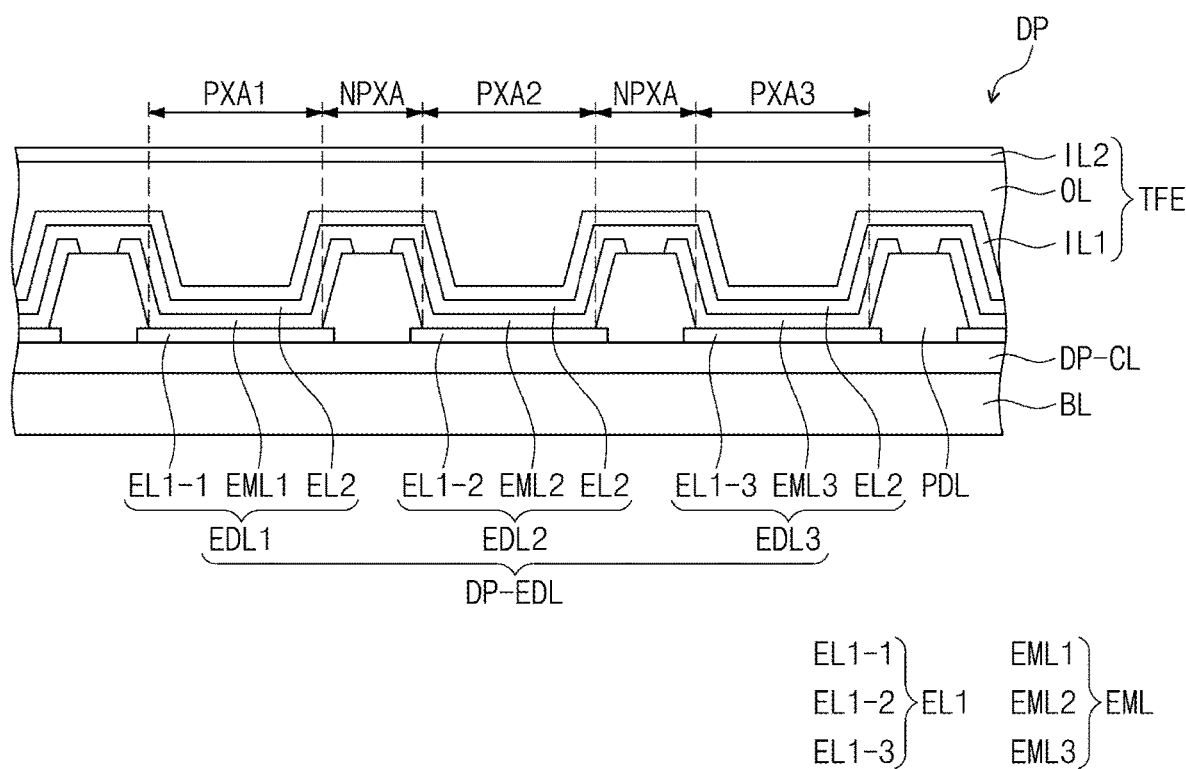
FIG. 14 is an enlarged cross-sectional view showing an area IV shown in FIG. 13.

FIG. 12 is a perspective view showing a display device DD according to an exemplary embodiment, FIG. 13 is a cross-sectional view showing the display device DD according to an exemplary embodiment, and FIG. 14 is an enlarged cross-sectional view showing an area IV shown in FIG. 13.

Referring to FIG. 12, the display device DD may include a display device DA and a non-display area NDA.

An image IM is displayed through the display area DA. The display area DA may be substantially parallel to a plane defined by the first direction DR1 and the second direction DR2. The third direction DR3 corresponds to a thickness direction of the display device DD.

The display device DD may be applied to a large-sized electronic item, such as a television set, a monitor, or an outdoor billboard, and a small and medium-sized electronic item, such as a personal computer, a notebook computer, a personal digital assistants, a car navigation unit, a game unit, a portable electronic device, or a camera, however, this is merely exemplary. The display device DD may be employed in other electronic items as long as they do not depart from the concepts of the present disclosure.

The non-display area NDA is defined adjacent to the display area DA, and the image IM is not displayed through the non-display area NDA. The non-display area NDA defines a bezel area of the display device DD.

The non-display area NDA may surround the display area DA, however, this is merely exemplary. The non-display area NDA may be defined to be adjacent to only a portion of an edge of the display area DA and should not be particularly limited.

Referring to FIG. 13, the display device DD may include a display panel DP and a sensing unit SU.

The display panel DP may include a base layer BL, a circuit layer DP-CL, a light emitting element layer DP-EDL, and a thin film encapsulation layer TFE. In the present descriptions, an organic light emitting display panel will be described as a representative example of the display panel DP, however, the inventive concepts should not be particularly limited.

The base layer BL may be a silicon substrate, a plastic substrate, a glass substrate, an insulating film, or a stacked structure including a plurality of insulating layers.

The circuit layer DP-CL may be disposed on the base layer BL. The circuit layer DP-CL may include a plurality of insulating layers, a plurality of conductive layers, and a semiconductor layer. The circuit layer DP-CL may include a plurality of transistors (not shown). Each transistor (not shown) may include a control electrode, an input electrode, and an output electrode. For example, the circuit layer DP-CL may include a switching transistor and a driving transistor to drive an organic electroluminescent light emitting element.

The light emitting element layer DP-EDL may be disposed on the circuit layer DP-CL. The light emitting element layer DP-EDL may include a light emitting element, e.g., organic light emitting diodes, however, it should not be limited thereto. The light emitting element layer DP-EDL may include inorganic light emitting diodes or organic-inorganic hybrid light emitting diodes depending on types of display panel.

The thin film encapsulation layer TFE encapsulates the light emitting element layer DP-EDL. The thin film encapsulation layer TFE includes a plurality of inorganic layers and at least one organic layer disposed between the inorganic layers. In addition, the thin film encapsulation layer TFE further includes a buffer layer. The buffer layer is the closest layer to the sensing unit SU. The buffer layer is an inorganic layer or an organic layer.

The sensing unit SU may include a circuit that senses a touch event. As a touch sensing method of the sensing unit SU, a resistive overlay method, an optical overlay method, a capacitive overlay method, and an ultrasonic wave method may be used, however, it should not be limited thereto. Among them, the capacitive overlay type sensing unit may sense whether the touch event occurs depending on the capacitance that varies when a touch generating member makes contact with a screen of the display device DD. The capacitive overlay method may be classified into a mutual capacitance method and a self-capacitance method.

The sensing unit SU may be directly disposed on the display panel DP. The expression "directly disposed" means that the sensing unit is formed on the display panel DP through a successive process without using a separate adhesive member, however, the inventive concepts should not be limited thereto. That is, the sensing unit SU and the display panel DP may be coupled to each other by an adhesive member (not shown). In addition, the sensing unit SU may be omitted in another embodiment.

Referring to FIG. 14, the light emitting element layer DP-EDL may include a pixel definition layer PDL and a plurality of organic electroluminescent light emitting elements EDL1, EDL2, and EDL3.

The pixel definition layer PDL may be a layer that defines a plurality of pixel areas PXA1 to PXA3 in the light emitting element layer DP-EDL. That is, the pixel definition layer PDL includes openings defined therethrough to correspond to the pixel areas PXA1 to PXA3, and an area in which the pixel definition layer PDL is formed may be defined as a non-pixel area NPXA.

The pixel definition layer PDL may be formed of a polymer resin. For example, the pixel definition layer PDL may include a polyacrylate-based resin or a polyimide-based resin. In addition, the pixel definition layer PDL may further include an inorganic material in addition to the polymer resin. Meanwhile, the pixel definition layer PDL may include a light absorbing material or may include a black pigment or a black dye. The pixel definition layer PDL formed by including the black pigment or the black dye may be implemented as a black pixel definition layer. When the pixel definition layer PDL is formed, a carbon black may be used as the black pigment or the black dye, however, the present exemplary embodiment should not be limited thereto.

The organic electroluminescent light emitting elements EDL1, EDL2, and EDL3 may be provided to respectively correspond to the pixel areas. The organic electroluminescent light emitting elements EDL1, EDL2, and EDL3 may include first electrodes EL1-1, EL1-2, and EL1-3, respectively. The first electrodes EL1-1, EL1-2, and EL1-3 are provided to correspond to the pixel areas and spaced apart from each other. The first electrodes EL1-1, EL1-2, and EL1-3 provided to the pixel areas PXA1 to PXA3 may form a first electrode layer EL1 formed on the circuit layer DP-CL. Each of the first electrodes EL1-1, EL1-2, and EL1-3 may be exposed through the opening of the pixel definition layer PDL.

The first electrodes EL1-1, EL1-2, and EL1-3 may be formed of a metal alloy or a conductive compound. The first electrodes EL1-1, EL1-2, and EL1-3 may be an anode. The first electrodes EL1-1, EL1-2, and EL1-3 may be a pixel electrode.

The first electrodes EL1-1, EL1-2, and EL1-3 in each organic electroluminescent light emitting element EDL may be a reflective type electrode, however, the inventive concepts should not be limited thereto. For example, the first electrodes EL1-1, EL1-2, and EL1-3 may be a transmissive type electrode or a transflective type electrode. When the first electrode EL1-1, EL1-2, and EL1-3 is the transflective type electrode or the reflective type electrode, the first electrodes EL1-1, EL1-2, and EL1-3 may include Ag, Mg, Cu, Al, Pt, Pd, Au, Ni, Nd, Ir, Cr, Li, Ca, LiF/Ca, LiF/Al, Mo, Ti, a compound thereof, or a mixture (e.g., a mixture of Ag and Mg). In addition, the first electrode EL1-1, EL1-2, and EL1-3 may have a multi-layer structure of a reflective or transflective layer formed of the above-mentioned materials and a transparent conductive layer formed of indium tin oxide (ITO), indium zinc oxide (IZO), zinc oxide (ZnO), or indium tin zinc oxide (ITZO). For example, the first electrodes EL1-1, EL1-2, and EL1-3 may have a multilayer metal film structure, e.g., a structure in which metal layers of ITO/Ag/ITO are stacked.

Each organic electroluminescent light emitting element EDL1, EDL2, and EDL3 further includes the light emitting layer EML and a second electrode EL2.

The light emitting layer EML may have a single-layer structure of a single material, a single-layer structure of a plurality of materials different from each other, or a multi-layer structure of a plurality of materials different from each other.

The light emitting layer EML may include first, second, and third light emitting layers EML1, EML2, and EML3 respectively provided in the pixel areas PXA1 to PXA3. The first, second, and third light emitting layers EML1, EML2, and EML3 may emit lights having different colors from each other. The first, second, and third light emitting layers EML1, EML2, and EML3 should not be particularly limited as long as they are commonly used materials and may include a fluorescent material or a phosphorescent material. In addition, the first, second, and third light emitting layers EML1, EML2, and EML3 may include a host and a dopant.

Although not shown in figures, a hole transport region may be defined between the light emitting layer EML and the first electrode layer EL1. The hole transport region may include a hole transport layer and a hole injection layer.

The second electrode EL2 is provided on the light emitting layer EML. The second electrode EL2 may be a common electrode or a cathode. The second electrode EL2 may be formed of a metal alloy or a conductive compound. The second electrode EL2 may be a transmissive type electrode, a transflective type electrode, or a reflective type electrode. When the second electrode EL2 is the transmissive type electrode, the second electrode EL2 may include a transparent metal oxide, for example, indium tin oxide (ITO), indium zinc oxide (IZO), zinc oxide (ZnO), or indium tin zinc oxide (ITZO).

When the second electrode EL2 is the transflective type electrode or the reflective type electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture (e.g., a mixture of Ag and Mg). In addition, the second electrode EL2 may have a multi-layer structure of a reflective or transflective layer formed of the above-mentioned materials and a transparent conductive layer formed of indium tin oxide (ITO), indium zinc oxide (IZO), zinc oxide (ZnO), or indium tin zinc oxide (ITZO).

The second electrode EL2 may be commonly provided over the first to third pixel areas PXA1 to PXA3.

An electron transport region may be defined between the second electrode EL2 and the light emitting layer EML. The electron transport region may include at least one of a hole blocking layer, an electron transport layer, and an electron injection layer, however, it should not be limited thereto. When the electron transport region includes the electron injection layer and the electron transport layer, a known electron injection material and a known electron transport material may be used for the electron injection layer and the electron transport layer, respectively.

The encapsulation layer TFE is disposed on the organic electroluminescent light emitting elements EDL1 to EDL3. The encapsulation layer TFE covers the organic electroluminescent light emitting elements EDL1 to EDL3. That is, the organic electroluminescent light emitting elements EDL1 to EDL3 may be encapsulated by the encapsulation layer TFE.

As an example of the inventive concepts, the encapsulation layer TFE may include a first inorganic layer IL1 an organic layer OL, and a second inorganic layer IL2, which are sequentially stacked. The organic layer OL may be disposed between the first inorganic layer IL1 and the second inorganic layer IL2. The first inorganic layer IL1 and the second inorganic layer IL2 may be formed by depositing an inorganic material, and the organic layer OL may be formed by depositing, printing, or coating an organic material.

The first inorganic layer IL1 and the second inorganic layer IL2 protect the organic electroluminescent light emitting elements EDL1 to EDL3 from moisture and oxygen, and the organic layer OL protects the organic electroluminescent light emitting elements EDL1 to EDL3 from a foreign substance, e.g., dust particles. The first inorganic layer IL1 and the second inorganic layer IL2 may include at least one of silicon nitride, silicon oxynitride, silicon oxide, titanium oxide, and aluminum oxide. The organic layer OL may include a polymer, e.g., an acrylic-based organic layer, however, this is merely exemplary.

FIG. 14 shows the encapsulation layer TFE including two inorganic layers and one organic layer as a representative example, however, the inventive concepts should not be limited thereto. For example, the encapsulation layer TFE may include three inorganic layers and two organic layers, and in this case, the inorganic layers may be alternately stacked with the organic layers.

According to the above, the collection sheet of the particle collection device includes the magnetic substance and the metal protrusions magnetized by the magnetic substance, and thus the collection sheet may collect the metal particles using magnetic force. As a result, the area for the collection of the collection sheet increases, and thus the collection efficiency may be improved.

In addition, the collection sheet has a partially protruding structure due to the metal protrusions, and the metal protrusions serve as seeds to accelerate the speed at which the metal particles are collected to the metal protrusions. Accordingly, the speed of collecting the metal particles may be improved, and the particle collection efficiency may be enhanced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A particle collection device comprising:
   a collection sheet comprising a base sheet, a magnetic substance, and a plurality of metal protrusions disposed on the base sheet to be adjacent to the magnetic substance; and
   a frame on which the collection sheet is mounted,
   wherein:
   the magnetic substance is buried in the base sheet to be surrounded by the base sheet;
   the magnetic substance has a stripe shape extending in a longitudinal direction of the base sheet; and
   the metal protrusions are arranged in the longitudinal direction along the magnetic substance.

2. The particle collection device of claim 1, wherein the metal protrusions are disposed on one side surface of the base sheet.

3. The particle collection device of claim 1, wherein the metal protrusions are disposed on a first side surface of the base sheet and on a second side surface opposite the first side surface.

4. The particle collection device of claim 1, wherein each of the metal protrusions has a hemispherical shape, a conical shape, or a cylindrical shape.

5. A particle collection device comprising:
   a collection sheet comprising a base sheet, a first magnetic substance buried in the base sheet, and a second magnetic substance disposed on the base sheet to face the first magnetic substance; and
   a frame on which the collection sheet is mounted.

6. The particle collection device of claim 5, wherein the second magnetic substance is disposed on one side surface of the base sheet.

7. The particle collection device of claim 5, wherein the second magnetic substance is disposed on a first side surface of the base sheet and a second side surface opposite the first side surface.

8. The particle collection device of claim 5, wherein the first magnetic substance has a stripe shape extending in a longitudinal direction of the base sheet.

9. The particle collection device of claim 8, wherein a plurality of second magnetic substances are provided, and the second magnetic substances are arranged in the longitudinal direction along the first magnetic substance.

10. The particle collection device of claim 9, wherein each of the second magnetic substances has a hemispherical shape, a conical shape, or a cylindrical shape.

11. The particle collection device of claim 5, wherein the collection sheet further comprises a capping layer that covers the second magnetic substance.

12. The particle collection device of claim 11, wherein the capping layer comprises a metal material.

13. A mask cleaning device comprising:
    a cleaning tank comprising a cleaning solution and cleaning a mask assembly disposed therein using the cleaning solution; and
    a particle collection device disposed in the cleaning tank to collect particles floating in the cleaning solution, the particle collection device comprising:
      a plurality of collection sheets comprising a base sheet, a magnetic substance, and a plurality of metal protrusions disposed on the base sheet to be adjacent to the magnetic substance; and
      a frame on which the collection sheets are mounted,
    wherein:
    the mask assembly comprises:
      a plurality of mask sheets each in which a processing pattern is formed; and
      a mask frame on which the mask sheets are mounted;
    the frame has a size corresponding to the mask frame and is spaced apart from the mask frame in the cleaning tank; and
    the magnetic substance has a stripe shape extending in a longitudinal direction of the base sheet, and the metal protrusions are arranged in the longitudinal direction along the magnetic substance.

14. The mask cleaning device of claim 13, wherein a plurality of mask assemblies are provided, and the particle collection device is disposed between the mask assemblies.

15. The mask cleaning device of claim 13, wherein the magnetic substance is buried in the base sheet to be surrounded by the base sheet, and the plurality of metal protrusions are disposed on at least one side surface of the base sheet.

* * * * *